United States Patent
Splett

(10) Patent No.: US 6,825,729 B2
(45) Date of Patent: Nov. 30, 2004

(54) FREQUENCY SYNTHESIZER WITH SIGMA-DELTA MODULATION

(75) Inventor: Armin Splett, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 146 days.

(21) Appl. No.: 10/258,140

(22) PCT Filed: Apr. 9, 2001

(86) PCT No.: PCT/DE01/01392

§ 371 (c)(1),
(2), (4) Date: Oct. 21, 2002

(87) PCT Pub. No.: WO01/80428

PCT Pub. Date: Oct. 25, 2001

(65) Prior Publication Data

US 2003/0102925 A1 Jun. 5, 2003

(51) Int. Cl.$^7$ .............................................. H03L 7/085
(52) U.S. Cl. .......................... 331/16; 331/1 A; 331/25; 327/105; 327/107; 327/159; 327/106; 375/376
(58) Field of Search ............................ 331/16, 1 A, 25; 327/105, 107, 159, 106; 375/376

(56) References Cited

U.S. PATENT DOCUMENTS

| | | | |
|---|---|---|---|
| 4,965,533 A | 10/1990 | Gilmore | 331/18 |
| 5,563,535 A | 10/1996 | Gorry et al. | 327/105 |
| 5,781,044 A * | 7/1998 | Riley et al. | 327/105 |
| 6,198,353 B1 * | 3/2001 | Janesch et al. | 331/16 |

FOREIGN PATENT DOCUMENTS

| | | |
|---|---|---|
| DE | 43 20 087 C1 | 8/1994 |
| EP | 0 866 560 A1 | 9/1998 |
| WO | WO 00/01072 | 1/2000 |

* cited by examiner

*Primary Examiner*—Arnold Kinkead
(74) *Attorney, Agent, or Firm*—Staas & Halsey LLP

(57) ABSTRACT

A frequency synthesizer, especially for mobile radio base stations, transforms a digital input signal having a first frequency rapidly into a digital output signal having a second frequency. Similar to an N-fractional synthesizer, in the frequency synthesizer, the digital input signal is fed to a series connection having a phase detector, a filter and a voltage-controlled oscillator. The conventional N/N+1 divider provided in the feedback path, as in an N-fractional synthesizer, is replaced by some sort of digital synthesizer that is clocked or supplied with the digital output signal that is produced by the voltage-controlled oscillator.

14 Claims, 5 Drawing Sheets

FREQUENCY SYNTHESIZER WITH SIGMA-DELTA MODULATION

CROSS REFERENCE TO RELATED APPLICATIONS

This application is based on and hereby claims priority to PCT Application No. PCT/DE01/01392 filed on Apr. 9, 2001 and German Application No. 100 19 487.7 filed on Apr. 19, 2000, the contents of which are hereby incorporated by reference.

BACKGROUND OF THE INVENTION

The invention relates to a frequency synthesizer, in particular for radio stations in a mobile radio system.

A frequency synthesizer in a form such as this is known in principle from U.S. Pat. No. 4,965,533.

Frequency synthesizers, which can be tuned within a few microseconds over the entire frequency band that is available for the transmission of radio signals, are required for frequency hopping in mobile radio base stations, for example to the GSM Standard (GSM: Global System for Mobile Communication). Furthermore, the signals which are produced by such frequency synthesizers must have very little phase noise, in order to achieve good transmission quality for the radio signals.

In order to satisfy these requirements, two frequency synthesizers are used, for example, in mobile radio base stations, and a switch is used to switch alternately between these two frequency synthesizers. However, the hardware complexity for such a solution is very high; furthermore, the frequency synthesizers must be isolated from one another, and this is complex, that is to say crosstalk from signals in the one frequency synthesizer to the other frequency synthesizer must be suppressed as well as possible.

In addition to the frequency synthesizer which is known from U.S. Pat. No. 4,965,533, a further embodiment of a frequency synthesizer is known (DE 43 20 087) which has a direct digital frequency synthesizer (DDS) in the feedback loop of a phase locked loop (PLL) arrangement, and a refinement of a direct digital frequency synthesizer is also known (U.S. Pat. No. 5,563,535).

The known circuit systems are not suitable either individually or in combination for quickly transforming an input signal at a very low frequency in comparison to the frequency of the output signal to an output signal at an RF carrier frequency.

SUMMARY OF THE INVENTION

One possible object of the present invention is therefore to design a frequency synthesizer, in particular for radio stations, with relatively little hardware complexity such that an input signal at a frequency which is very low in comparison to the frequency of the output signal is transformed quickly to an output signal at an RF carrier frequency.

A frequency synthesizer according to the invention, in particular for radio stations, transforms a digital input signal at a first frequency to a digital output signal at a second frequency. In a similar way to a "fractional N" synthesizer, the digital input signal is supplied to a series circuit comprising a phase detector, a filter and a voltage controlled oscillator. The digital output signal is fed back to a second input of the phase detector, which compares the phases of the fed-back signal and the digital input signal, and accordingly supplies its output signal to a downstream filter, in the present case a loop filter. The loop filter filters the supplied output signal from the phase detector and maps it onto a voltage which is suitable for driving the voltage controlled oscillator. The voltage controlled oscillator then produces the digital output signal at the second frequency, as a function of the voltage supplied to it.

When used in mobile radio base stations, the frequency synthesizer is intended to transform a digital input signal at a first frequency as quickly as possible to a digital output signal at a second frequency. This fast conversion or transformation is now achieved by a digital synthesizer in the feedback path of the frequency synthesizer. One major aspect is, accordingly, that the normal N/N+1 divider provided in the feedback path is replaced, as in the "fractional N" synthesizer, by a type of digital synthesizer which is clocked or fed with the digital output signal that is produced by the voltage controlled oscillator. Firstly, this saves the complex and, above all, technologically critical switchable loop filters, which are required in a "fractional N" synthesizer for fast and "clean" switching, that is to say switching without interference, between different frequencies of the digital output signal. Furthermore, the digital synthesizer is preferably suitable for an embodiment in the form of an integrated circuit. Since the frequency of the digital output signal is normally considerably higher than the frequency of the digital input signal, the output signal from the digital synthesizer may be produced in a very wide frequency range around the frequency of the digital input signal to be so pure, that is to say without interference, that there is no longer any need for a switchable loop filter as in the "fractional N" synthesizer. Furthermore, the digital synthesizer can be digitally programmed easily, so that the frequency synthesizer can be driven by digital signals, for example, directly from a logic circuit or from a processor.

The digital synthesizer preferably has a first sigma-delta modulator, which transforms the digital output signal to a signal at a third frequency, which is suitable for processing by the phase detector and by further modules upstream of it. In particular, the first sigma-delta modulator is preferably fourth order. This embodiment has been found to be the best compromise between hardware complexity and the achievable frequency synthesizer accuracy.

In particular, the first sigma-delta modulator is driven by a digital oscillator, to which the digital output signal is supplied. The digital oscillator in a first preferred embodiment comprises a series circuit formed by a second sigma-delta modulator, which is preferably fourth order, and a digital integrator. The digital output signal is down-mixed via the digital oscillator, that is to say it is transformed to a signal at another frequency, especially at a lower frequency.

In one preferred embodiment, the digital integrator has a modulo-N integrator and a memory. The modulo-N integrator integrates the output signal from the second sigma-delta modulator in the discrete time domain modulo-N and produces a digital output signal, which drives the memory which in turn contains a table with N values of the sine-wave function. A specific value of the sine-wave function is thus read from the memory via the digital output signal from the modulo-N integrator, and is passed as an input signal to the first sigma-delta modulator. The formal relationship between the input signal or value "i" of the memory and the function values stored in the memory is in this case $4\sin(2\pi i/N)$.

The digital synthesizer preferably has an analog modulator, to which the digital output signal and the output signal from the first sigma-delta modulator are supplied, and which produces a signal which is supplied to the second input of the phase detector. The analog modulator is used to suppress jitter in the output signal from the digital synthesizer and thus, in the end, to achieve high accuracy in the transformation of the digital input signal of the frequency synthesizer to the digital output signal.

Finally, in a further preferred embodiment, the digital synthesizer is followed by a bandpass filter, in order to remove interference frequencies, in particular harmonics and spurious responses, from the output signal from the digital synthesizer, which interference frequencies can likewise influence the accuracy of the transformation by the frequency synthesizer.

An alternative embodiment of the implementation according to the described related art is the use of a so-called "fractional N" synthesizer instead of two frequency synthesizers, with the "fractional N" synthesizer having a high comparison frequency as well as a wide loop bandwidth and hence a short tuning time. This is achieved by setting a broken-rational division ratio between the comparison frequency and the output frequency from the frequency synthesizer. Since phase interference can occur during switching of the normally used N/N+1 divider in the "fractional N" synthesizer, sigma-delta modulation must be used to process the output signal from the divider, which results in the interference being spectrally distributed in frequency ranges which can be suppressed by a loop filter. In this case, the bandwidth which is available for spectral distribution of the phase interference is governed by the comparison frequency, which is normally produced by crystal oscillators which have an oscillation frequency below about 100 MHz. For a rapid tuning capability, switchable loop filters are thus required corresponding to the output frequencies to be generated, whose implementation requires a high level of hardware complexity, however, and which, furthermore, are difficult to achieve technologically.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
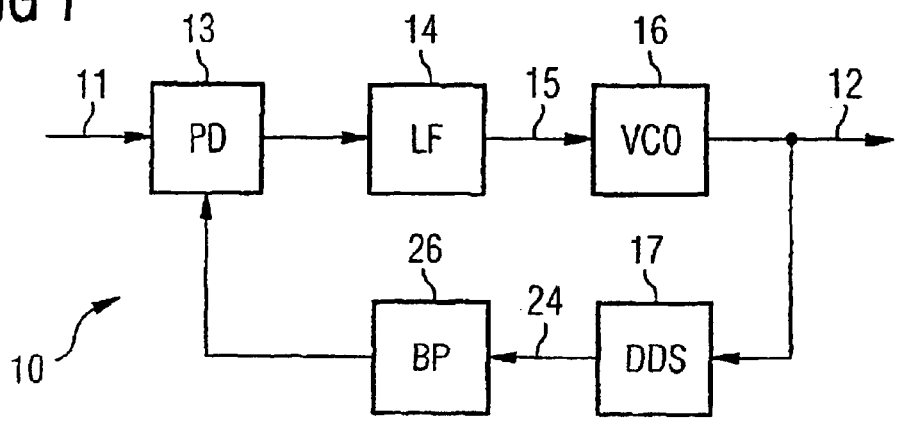
FIG. 1 shows a block diagram of one exemplary embodiment of the frequency synthesizer according to one embodiment of the invention.

Reference will now be made in detail to the preferred embodiments of the present invention, examples of which are illustrated in the accompanying drawings, wherein like reference numerals refer to like elements throughout.

FIG. 1 shows a block diagram of one exemplary embodiment of the frequency synthesizer according to one embodiment of the invention with the major blocks for carrying out the transformation of a digital input signal 11 at a first frequency to a digital output signal 12 at a second frequency. The carrier frequency or the first frequency of the digital input signal 11 in this example is 50 MHz, and the second frequency or carrier frequency of the digital output signal 12 is 1.6 GHz. A digital baseband input signal is thus transformed by the frequency synthesizer 10 to a digital signal which is in a frequency range of the frequency spectrum which is directly suitable for transmission via a mobile radio channel.

The abovementioned frequency values in this case correspond only to typical operating values and may vary appropriately depending on the requirement, and, in particular, on the mobile radio standard being used. The frequency of the input signal is typically in the range from 10 MHz to 100 MHz. The frequency of the output signal is typically in the range from 700 MHz to 3500 MHz.

The block diagram as shown in FIG. 1 will be explained in the following text with reference to the processing of the digital input signal. The digital input signal 11 is supplied to a first input of a phase detector 13. The phase detector 13 compares the phase of the digital input signal 11 with the phase of a fed-back signal, and passes an output signal to a filter 14 (also referred to as a loop filter) as a function of the phase difference. The filter 14 is essentially used for integration of the received signal and passes an output signal or a voltage 15 to a voltage controlled oscillator 16, which produces a digital output signal 12 at a frequency which is dependent on the voltage 15 supplied to the voltage controlled oscillator 16. Particularly when used in mobile radio base stations, the digital output signal 12 is at a very much higher carrier frequency than the digital input signal 11 (as already mentioned, 1.6 GHz for example, in comparison to 50 MHz). In a similar way to that in the "fractional-N" synthesizer which has already been mentioned above, the digital output signal 12 is now fed back, and is passed to a second input of the phase detector 13 for the abovementioned phase comparison with the digital input signal 11.

A digital synthesizer 17 is provided in the feedback path, which synthesizer 17 receives the digital output signal 12, and transforms this to a digital signal 24 which is in turn supplied to a bandpass filter 26. The bandpass filter 26 removes or filters the interference frequencies out of the supplied signal 24, such as harmonics or spurious responses. The output signal from the bandpass filter, which now corresponds to the filtered output signal 24 from the digital synthesizer 17, is passed to the second input of the phase detector 13, which compares its phase with that of the digital input signal 11.

Figure 2:
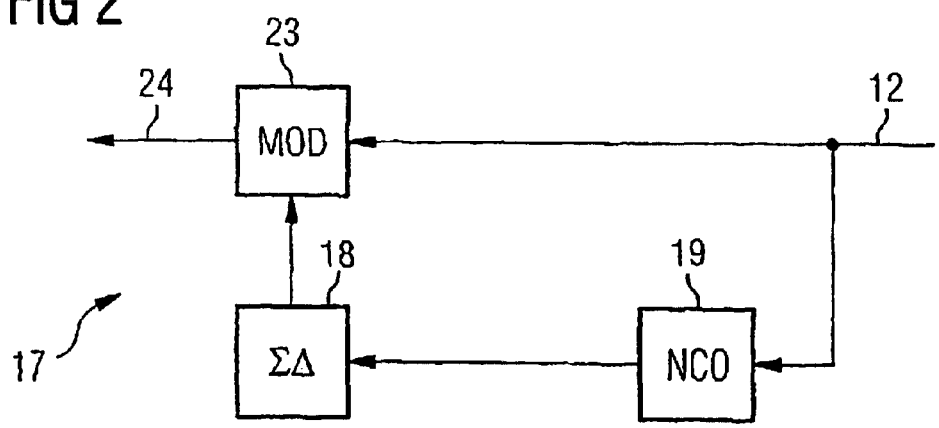
FIG. 2 shows a block diagram of one exemplary embodiment of the digital synthesizer, which is connected in the feedback path of the frequency synthesizer as shown in FIG. 1.

FIG. 2 shows a block diagram of the digital synthesizer 17. The digital output signal 12 from the frequency synthesizer 10 is supplied firstly to an analog modulator 23 and secondly to a digital oscillator 19. The analog modulator 23 is used essentially for suppressing jitter contained in the digital output signal 12. The frequency of the digital output signal 12 is essentially governed by the digital oscillator 19. This will be explained in more detail with reference to the following figures. The digital oscillator 19 is followed by a first sigma-delta modulator 18 whose output signal is supplied to a second input of the analog modulator 23. The sigma-delta modulator 18 reduces the word length of the supplied signal. The quantization error that occurs in this process is distributed in the frequency domain, so that it can easily be removed by filtering. The bandpass filter 26 or the loop filter 14, or a combination of both filters, may be used for filtering. The sigma-delta modulator 18 is used in a known manner to improve the signal-to-noise ratio of the output signal 24.

Figure 3:
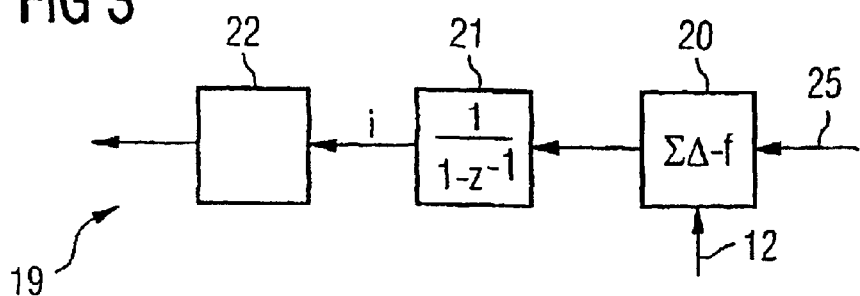
FIG. 3 shows an exemplary embodiment of the digital oscillator which is used in the digital synthesizer.

FIG. 3 uses a further block diagram to show the detailed design of the digital oscillator 19. A second sigma-delta modulator 20 is supplied firstly with the digital output signal 12 and secondly with an adjustment signal 25. The adjustment signal 25 which, for example, can be produced by a digital control circuit or a microprocessor, is now used essentially for adjustment of the ratio of the carrier frequency of the digital output signal 12 to the carrier frequency of the digital input signal 11. For this purpose, the digital adjustment signal 25 corresponds to a value N $f_{SIN}/f_{VCO}$. The output signal from the sigma-delta modulator 20 is integrated by a modulo-N integrator 21 in the discrete time domain modulo-N (discrete transfer function $1/(1-z^{-1})$, with the output signal 12 being used for the clock frequency). The signal "i" obtained in this way, or the corresponding digital value, is used for driving a memory 22, in which N values of the sine-wave function are stored in the form of a table. The drive signal "i" for the memory 22 ideally corresponds to the address of a memory cell in which the value of the sine-wave function associated with the input signal "i" is stored. The formal relationship between the input signal or value "i" and the sine-wave function is as follows: $4 \sin(2\pi i/N)$. To this extent, the digital output signal 12 is transformed by the adjustment signal 25 and the second sigma-delta modulator to a third frequency range, or to a signal at a third frequency, which differs considerably from the second frequency or the second frequency range of the digital output signal 12, is integrated, and is converted by reading from a table to a sine-wave function at a specific frequency corresponding to the value N.

Figure 7:
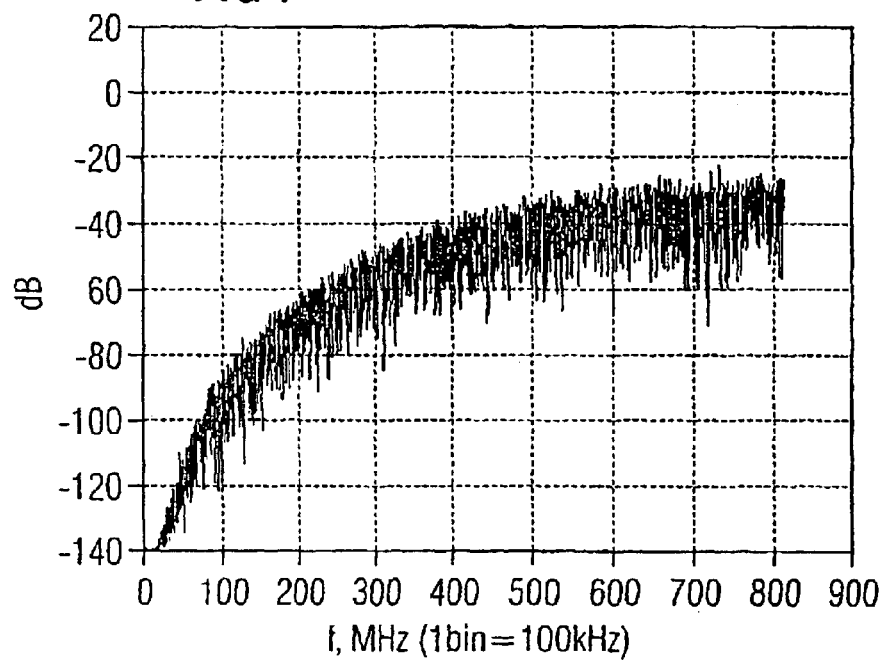
FIG. 7 shows a diagram with the simulated frequency spectrum of the output signal from the second sigma-delta modulator, which is used in the digital oscillator, for N=512.

FIG. 7 shows the frequency spectrum of the output signal produced in this way. The illustrated frequency spectrum corresponds to a simulation, in which the sigma-delta modulators that are used are fourth order, and a 31-stage analog modulator is used. It can easily be seen from the frequency spectrum, that a signal-to-noise ratio of virtually 150 dB/Hz is achieved.

Figure 4:
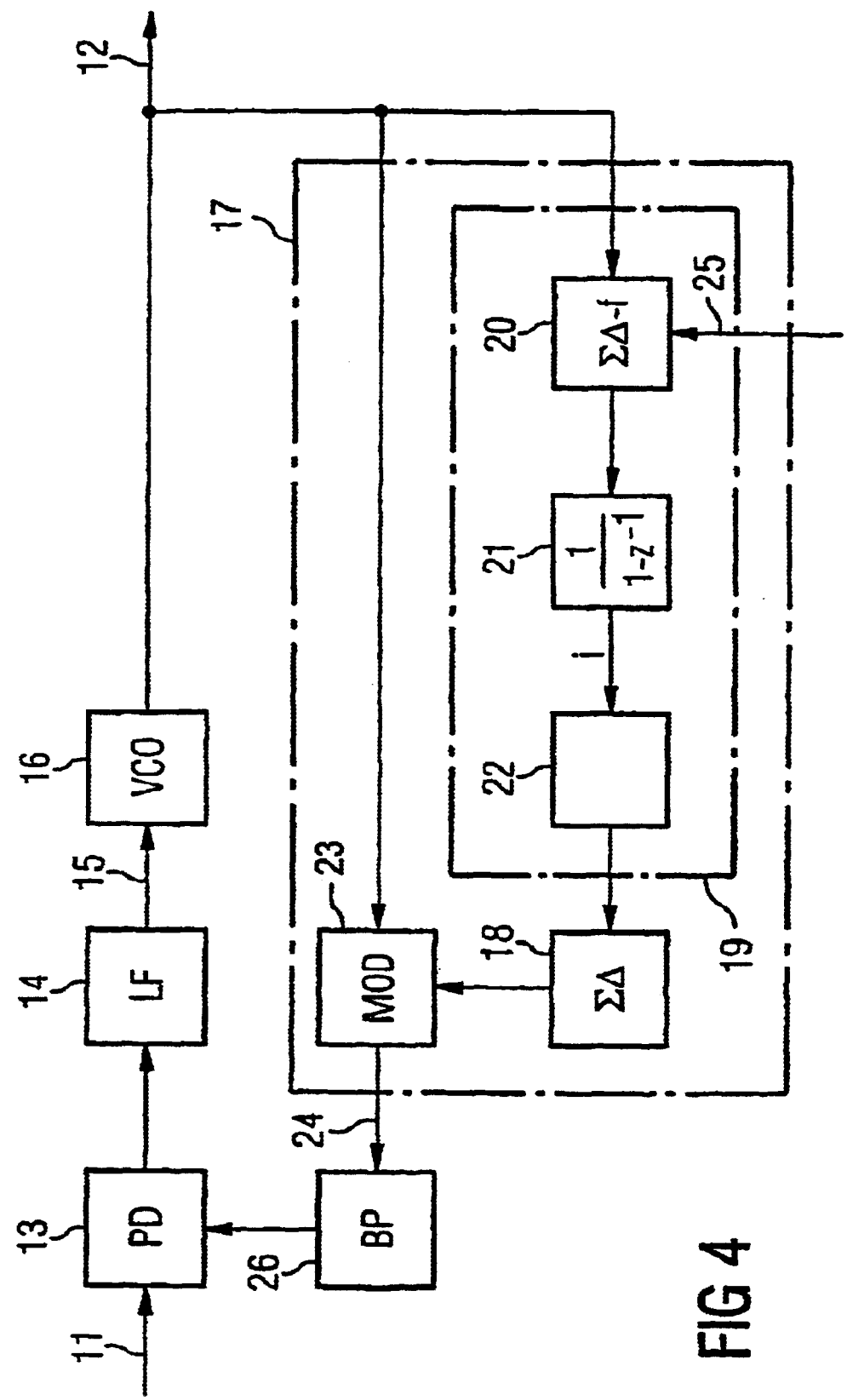
FIG. 4 shows a block diagram of the exemplary embodiment of the frequency synthesizer as illustrated in FIG. 1, including the block diagrams illustrated in FIG. 2 and FIG. 3.

FIG. 4 once again shows a block diagram of the frequency synthesizer as illustrated in FIG. 1, in which, however, the digital synthesizer in the feedback path is shown in detail, as in FIGS. 2 and 3. It can be seen from the block diagram illustrated in FIG. 4 that the frequency synthesizer essentially receives two different input signals, and produces one output signal. The input signals are firstly the digital input signal 11, which is transformed to the digital output signal 12, and the adjustment signal 25, via which the frequency ratio between the digital output signal 12 and the digital input signal 11, and hence the second frequency to be produced in the output signal 12, is set.

Figure 5:
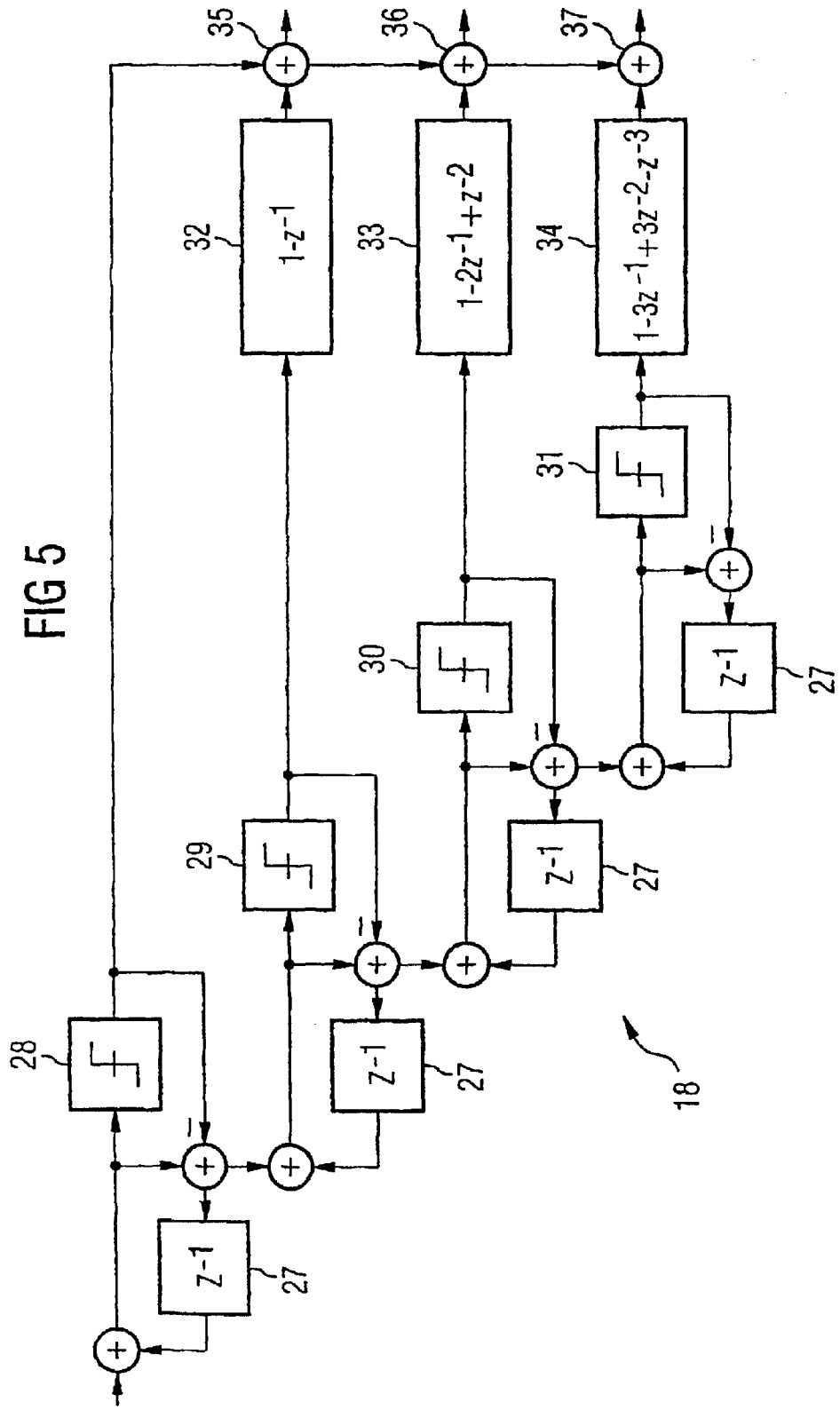
FIG. 5 shows a block diagram of one exemplary embodiment of the first sigma-delta modulator, which is used in the digital synthesizer.

FIG. 5 shows the design of one exemplary embodiment of the first sigma-delta modulator 18, which is fourth order. The sigma-delta modulator 18 has four different paths, whose output signals are added by adders 35–37 to form an output signal from the sigma-delta modulator 18. Each path in the sigma-delta modulator 18 each has a delay element ($z^{-1}$) 27 and a decision maker 28–31. The decision maker in the first path emits as its output value +8, −8 or 0 when the input signal is >+4, <−4 or is in the range between +4 and −4. The decision maker 29 in the second path emits as its output signal +4, −4 or 0 when the input signal is >+2, <−2 or is in a range from +2 to −2. The decision maker 30 in the third path emits as its output signal +2, −2 or 0, depending on whether the input signal is >+1, <−1, or is in the range between +1 and −1. Finally, the fourth decision maker 31 in the fourth path emits as its output signal +1, −1 or 0, depending on whether the input signal is >+0.5, <−0.5 or is in a range between +0.5 and −0.5. The decision makers 29 to 31 are followed by a respective digital filter 32 to 34 of first, second or third order. Otherwise, the sigma-delta modulator 18 is designed in the same way as that known from sigma-delta modulators according to the related art.

Figure 6:
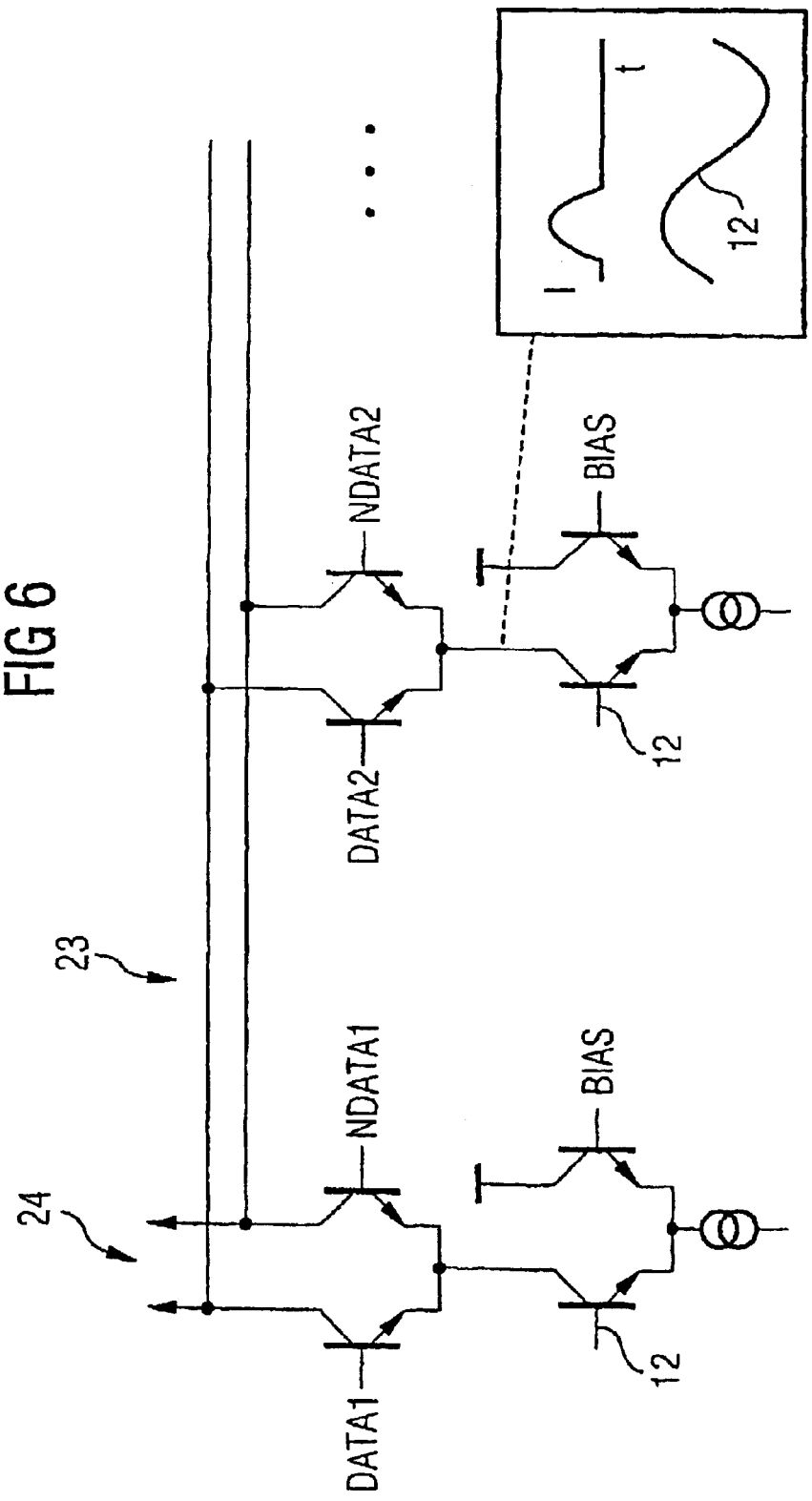
FIG. 6 shows an exemplary embodiment of an analog modulator which is used in the digital frequency synthesizer.

FIG. 6 shows an exemplary embodiment of the circuit of the analog modulator 23. The analog modulator has a total of 31 stages, with each stage having two series-connected differential amplifiers composed of npn bipolar transistors.

Each stage in the analog modulator 23 is formed as follows: a current source is connected to the foot point of the first differential amplifier. The digital output signal 12 on the one hand and a signal (which is referred to as BIAS) for setting the switching point of the first differential amplifier are supplied as input signals to the first differential amplifier. The right-hand transistor in the first differential amplifier, which is driven by the signal BIAS, is connected at its collector to a reference potential, for example ground. The left-hand transistor in the first differential amplifier, to which the digital output signal 12 is supplied as an input signal, to be precise 1 bit of the digital output signal 12, is connected at its collector to the foot point of the second differential amplifier. The second differential amplifier receives, as a pair of input signals, signals which are referred to as DATA1 and NDATA1, which, at least partially, are output signals from the sigma-delta modulator 18 which drives the analog modulator 23. The pair of output signals 24 from the analog modulator 23 are supplied—as illustrated by way of example in FIG. 4—to the bandpass filter 26.

FIG. 6 also shows the time profile of the current as a function of the digital output signal 12 which is produced at the left-hand transistor of the first differential amplifier. It can be seen from this that a collector current flows in the left-hand transistor in the first differential amplifier only during the positive half-cycle of the sinusoidal digital output signal 12.

The pairs of signals DATA1, NDATA1 to DATA31, NDATA31 have the following digital values:

DATA1–DATAn=1,
NDATA1–NDATAn=0,
DATA(n+1)–DATA31=0, and
NDATA(n+1)–NDATA31=1.

The signal with the index n-16 corresponds to the output signal from the sigma-delta modulator 18.

Figure 8:
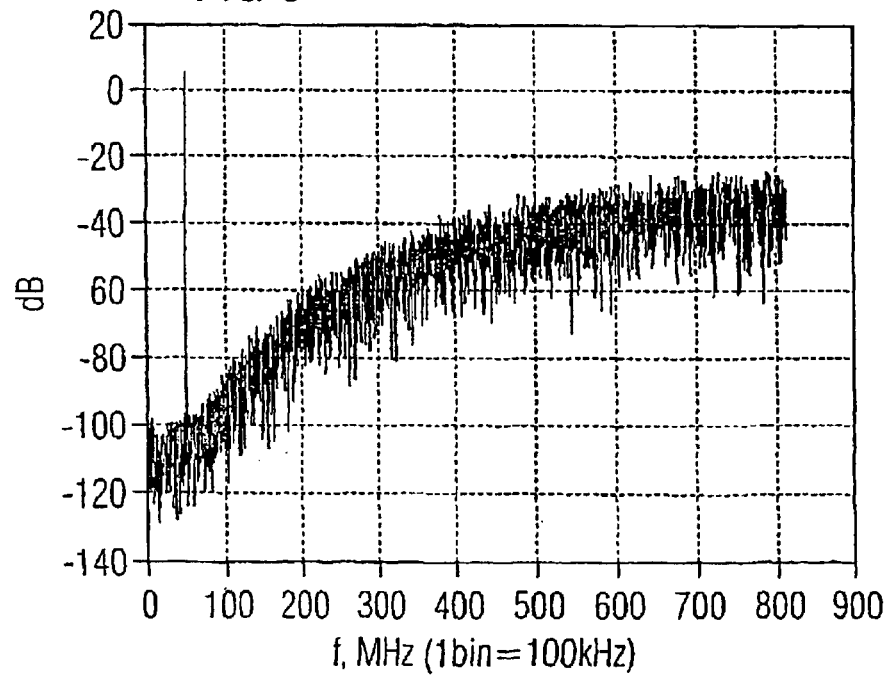
FIG. 8 shows a diagram with the simulated spectrum of the output signal from the digital synthesizer for N=512.

Finally, FIG. 8 shows the simulated frequency spectrum of the output signal for the digital synthesizer 17 for a value n=512. The greatest signal-to-noise ratio of about 120 dB/Hz is achieved in the range from 0 to about 50 MHz. As the frequencies increase, the signal-to-noise ratio falls to values of about 40 to 30 dB/Hz. The signal-to-noise ratio can be improved firstly by enlarging the table stored in the memory 22 (by copying the values of the sine-wave function stored there, that is to say by finer resolution of the sine-wave function stored there), and secondly by transformation of the sigma-delta modulator 18 from the low-pass range to the bandpass range.

The invention has been described in detail with particular reference to preferred embodiments thereof and examples, but it will be understood that variations and modifications can be effected within the spirit and scope of the invention.

What is claimed is:

1. A frequency synthesizer, which transforms a digital input signal at a first frequency to a digital output signal at a second frequency, comprising:

a phase detector having first and second inputs and an output, with the first input receiving the digital input signal;

a filter to receive the output from phase detector and produce an output signal;

a voltage controlled oscillator driven by the output signal of the filter to produce the digital output signal; and a digital synthesizer to transform the digital output signal to a signal at a third frequency, which is fed back to the second input of the phase detector for the phase detector to compare the phase of the signal at the third frequency with the phase of the digital input signal, the digital synthesizer comprising:

a first sigma-delta modulator; and a digital oscillator supplied with the digital output signal to drive the first sigma-delta modulator, the digital oscillator comprising a series circuit of a second sigma-delta modulator and a digital integrator.

2. The frequency synthesizer as claimed in claim 1, wherein the first sigma-delta modulator is a fourth order sigma-delta modulator.

3. The frequency synthesizer as claimed in claim 1, wherein the digital integrator has a modulo-N integrator and a memory, with the modulo-N integrator driving the memory, and a table with N values of a sine-wave function being stored in the memory.

4. The frequency synthesizer as claimed in claim 1, wherein the digital synthesizer has an analog modulator, to which the digital output signal and an output signal from the first sigma-delta modulator are supplied, and the analog modulator produces a signal which is supplied to the second input of the phase detector.

5. The frequency synthesizer as claimed in claim 1, further comprising a bandpass filter positioned between the digital synthesizer and the second input of the phase detector to remove interference frequencies from the signal at the third frequency.

6. The frequency synthesizer as claimed in claim 1, further comprising a bandpass filter positioned between the digital synthesizer and the second input of the phase detector to remove harmonics and spurious responses from the signal at the third frequency.

7. The frequency synthesizer as claimed in claim 1, wherein said frequency synthesizer is in the form of a radio station.

8. The frequency synthesizer as claimed in claim 1, wherein said frequency synthesizer is in the form of a base station, in a mobile radio system.

9. The frequency synthesizer as claimed in claim 1, wherein the second sigma-delta modulator is a fourth order sigma-delta modulator.

10. The frequency synthesizer as claimed in claim 2, wherein the digital integrator has a modulo-N integrator and a memory, with the modulo-N integrator driving the memory, and a table with N values of a sine-wave function being stored in the memory.

11. The frequency synthesizer as claimed in claim 10, wherein the digital synthesizer has an analog modulator, to which the digital output signal and an output signal from the first sigma-delta modulator are supplied, and the analog modulator produces a signal which is supplied to the second input of the phase detector.

12. The frequency synthesizer as claimed in claim 11, further comprising a bandpass filter positioned between the digital synthesizer and the second input of the phase detector to remove interference frequencies from the signal at the third frequency.

13. The frequency synthesizer as claimed in claim 12, wherein said frequency synthesizer is in the form of a radio station.

14. The frequency synthesizer as claimed in claim 13, wherein the second sigma-delta modulator is a fourth order sigma-delta modulator.

* * * * *